United States Patent
Yoshida et al.

(10) Patent No.: US 8,775,752 B2
(45) Date of Patent: Jul. 8, 2014

(54) VIRTUAL MEMORY MANAGEMENT APPARATUS AND MEMORY MANAGEMENT APPARATUS

(75) Inventors: Hideki Yoshida, Tokyo (JP); Tatsunori Kanai, Kanagawa-ken (JP); Masaya Tarui, Kanagawa-ken (JP); Yutaka Yamada, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 165 days.

(21) Appl. No.: 13/371,541

(22) Filed: Feb. 13, 2012

(65) Prior Publication Data

US 2012/0151119 A1 Jun. 14, 2012

Related U.S. Application Data

(63) Continuation of application No. PCT/JP2009/004781, filed on Sep. 21, 2009.

(51) Int. Cl.
*G06F 12/12* (2006.01)
*G06F 12/08* (2006.01)
*G06F 12/10* (2006.01)

(52) U.S. Cl.
CPC ............... *G06F 12/08* (2013.01); *G06F 12/12* (2013.01); *G06F 12/1009* (2013.01)
USPC ........................ 711/159; 711/160; 711/206

(58) Field of Classification Search
CPC ...... G06F 12/08; G06F 12/12; G06F 12/1009
USPC .......................... 711/159, 160, 206
See application file for complete search history.

(56) References Cited

U.S. PATENT DOCUMENTS

| | | | |
|---|---|---|---|
| 2003/0229650 A1* | 12/2003 | Olstad et al. .................. | 707/200 |
| 2006/0069885 A1* | 3/2006 | Matsui et al. ................. | 711/154 |
| 2006/0184740 A1* | 8/2006 | Ishikawa et al. ............. | 711/129 |
| 2007/0118695 A1* | 5/2007 | Lowe et al. ................... | 711/136 |
| 2009/0216945 A1* | 8/2009 | Shimada ....................... | 711/113 |
| 2010/0161881 A1* | 6/2010 | Nagadomi et al. ........... | 711/103 |
| 2011/0208914 A1* | 8/2011 | Winokur et al. ............. | 711/119 |

FOREIGN PATENT DOCUMENTS

| | | |
|---|---|---|
| JP | 2006-227688 | 8/2006 |
| JP | 2007-141225 | 6/2007 |
| JP | 2010-152747 | 7/2010 |

OTHER PUBLICATIONS

Silvers, Chuck, "UBC: An Efficient Unified I/O and Memory Caching Subsystem for NETBSD", Proceedings of FREENIX Track: 2000 USENIX Annual Technical Conference, Jun. 18-23, 2000.
Wu, Michael, et all., "eNVy: A Non-Volatile, Main Memory Storage System", International Conference on Architectural Support for Programming languages and Operating Systems (ASPLOS), Oct. 1994.

(Continued)

*Primary Examiner* — Than Nguyen
(74) *Attorney, Agent, or Firm* — Amin, Turocy & Watson, LLP

(57) ABSTRACT

A virtual memory management apparatus of an embodiment is embedded in a computing machine 80 and is provided with an application program 21, an operating system 22, a volatile memory 11, and a nonvolatile memory 12. The volatile memory 11 is provided with a plurality of clean pages. The nonvolatile memory 12 is provided with a plurality of dirty pages and a page table memory unit 51. The operating system 22 is provided with a virtual memory management unit 23 which includes a page transfer unit 25.

16 Claims, 9 Drawing Sheets

(56) References Cited

OTHER PUBLICATIONS

Baker, Mary, et al., "Non-Volatile Memory for Fast, Reliable File Systems", Fifth International Conference on Architectural Support for Programming Languages and Operating Systems (ASPLOS-V); Oct. 1992.

Office Action of Notice of Reasons for Refusal for Japanese Patent Application No. 2011-531671 Dated May 15, 2013, 7 pgs.

* cited by examiner

| LOGICAL PAGE NUMBER | PHYSICAL PAGE NUMBER | PRESENCE BIT | DIRTY/ CLEAN | NONVOLATILE MEMORY /VOLATILE MEMORY | DISK ADDR | PROTECTION |
|---|---|---|---|---|---|---|
| 0 | 130b68··· | 1 | 0 | 1 | SECTOR2, TRACK3 | READ ONLY |
| 1 | 353cd3··· | 1 | 1 | 1 | SECTOR4, TRACK6 | READ ONLY |
| 2 | 281f47··· | 1 | 1 | 1 | SECTOR8, TRACK17 | READ ONLY |
| 3 | 0 | 0 | 0 | 1 | SECTOR11, TRACK23 | |
| ······ | ······ | ······ | ······ | ······ | ······ | ······ |

FIG. 4

VIRTUAL MEMORY MANAGEMENT APPARATUS AND MEMORY MANAGEMENT APPARATUS

CROSS REFERENCE TO RELATED APPLICATION

This application is a continuation application of International Patent Application No. PCT/JP2009/004781, filed on Sep. 21, 2009, the entire contents of which are incorporated herein by reference.

FIELD

Embodiments described herein relate to a virtual memory management apparatus.

BACKGROUND

A virtual memory technique has been employed in computing machine systems in recent years in order to deal with an increase of the information volume to be processed. Virtual memory is a technique in which data is transferred between a secondary memory unit and a primary memory unit as appropriate to allow an application program to operate as if there is a memory (a virtual memory) with a large capacity and a high access speed. To attain the technique, the primary memory unit (a main memory) and the secondary memory unit (a virtual memory space) are provided. The primary memory unit includes a volatile memory, a nonvolatile memory and the like each having a high memory access speed and a relatively small capacity, and the secondary memory unit includes a hard disk and the like having a lower memory access speed but a larger capacity than the primary memory unit. A paging technique based on pages is one of techniques concerning replacement control between the virtual memory space and a real memory space as well as translation control from a virtual address to a real address. In address translation by paging, a virtual page on a virtual memory is linked to a physical page on a physical memory. Japanese Patent Application Publication No. 2008-158773 discloses a virtual memory management apparatus to perform address translation by paging.

However, according to the virtual memory management apparatus, virtual pages include a clean page for which the same contents are stored in the primary memory unit and the secondary memory unit, and a dirty page for which the memory contents rewritten in the primary memory unit is not reflected in the secondary memory unit. In the virtual memory, data of a clean page will not be lost, but data of a dirty page will be lost in case of power outage. Once the data of the dirty page is lost, the data cannot be recovered even when a page table is reconstructed by rebooting a computing machine.

BRIEF DESCRIPTION OF THE DRAWINGS

FIG. 4 is a view showing a configuration of the page table according to the first embodiment;

DETAILED DESCRIPTION

Figure 1:
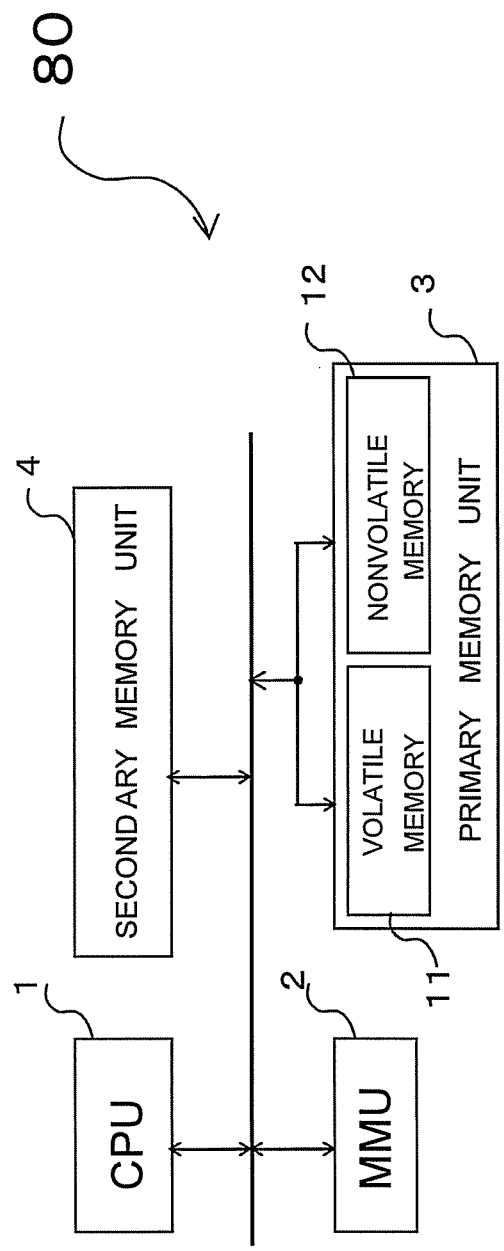
FIG. 1 is a block diagram showing a configuration of a computing machine according to a first embodiment.

According to one embodiment, a virtual memory management apparatus includes a primary memory unit and a secondary memory unit having a lower memory access speed than the primary memory unit and having a larger memory capacity than the primary memory unit. The virtual memory management apparatus is provided with a volatile memory located in the primary memory unit and configured to store data of a clean page being identical to data stored in the secondary memory unit and to be randomly readable and writable and a nonvolatile memory located in the primary memory unit, configured to store data of a dirty page different from the data stored in the secondary memory unit and a page table at least including information indicating which page is the dirty page, and configured to be randomly readable and writable.

Hereinafter, further plural examples are described with reference to the drawings. In the drawings, the same numeral indicates the same or similar portions.

First Embodiment

To begin with, a virtual memory management apparatus according to a first embodiment will be described with reference to the drawings. FIG. 1 is a block diagram showing a configuration of a computing machine. In the embodiment, a primary memory unit includes a volatile memory and a nonvolatile memory. Moreover, clean pages in a virtual memory are stored in the volatile memory of the primary memory unit, and dirty pages in the virtual memory are stored in the nonvolatile memory of the primary memory unit.

As shown in FIG. 1, a computing machine 80 includes a CPU (central processing unit) 1, a MMU (memory management unit) 2, a primary memory unit 3 (a main memory), and a secondary memory unit 4 (such as a large capacity disk storage), and the like.

The computing machine 80 is a computing machine configured to operate an operating system supporting virtual memory by paging. The paging is the technique to perform translation from a virtual address to a real address based on the pages. The paging is executed by the operating system and the MMU 2. Pages represent regions and units. Each page includes codes and data and belongs to a virtual page or a real page. The computing machine 80 is a computer which allows an end user to execute business processing and the like. The computing machine 80 may be a server to perform processing in response to a request from a client through a network or may be an embedded computer to control an instrument.

The CPU 1 performs integrated control of the entire computing machine 80. The CPU 1 reads the operating system, for example, sequentially from the main memory and executes an application program based on the operating system.

The MMU 2 executes a translation work between a virtual page and a physical page and performs actual access to the main memory based on an instruction from the CPU 1.

The primary memory unit 3 (the main memory) includes a volatile memory 11 and a nonvolatile memory 12 each having a high memory access speed and being randomly writable. Data stored in the volatile memory 11 will be lost when power is turned off. Although the volatile memory 11 uses a SRAM (static random access memory), a DRAM (dynamic random access memory) or the like may be used instead. Data stored in the nonvolatile memory 12 will not be lost even when the power is turned off. Although the nonvolatile memory 12 uses a FeRAM (ferroelectric random access memory), a MRAM (magnetic random access memory), a ReRAM (resistive random access memory) or the like may be used instead.

The secondary memory unit 4 has a larger capacity than the primary memory unit 3. Although the secondary memory unit 4 uses hard disk storage, a flash memory or the like may be used instead. The CPU 1 reads and writes data in the primary memory unit 3 and the secondary memory unit 4, and transfers the data between the primary memory unit 3 and the secondary memory unit 4. Here, a DMA (direct memory access) controller may be provided between the primary memory unit 3 and the secondary memory unit 4 so as to read and write the data directly without the CPU 1.

Figure 2:
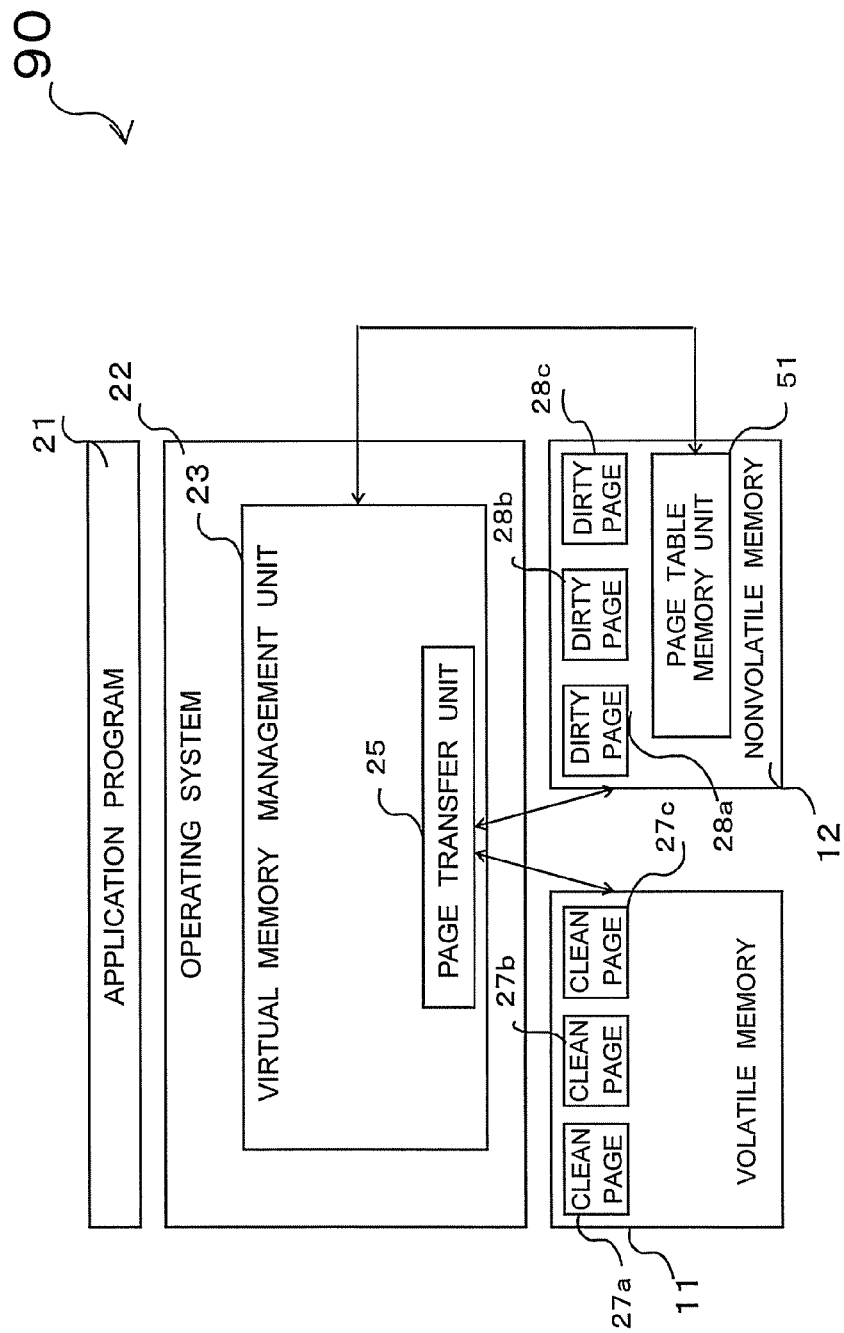
FIG. 2 is a block diagram showing a configuration of a virtual memory management apparatus according to the first embodiment.

FIG. 2 is a block diagram showing a configuration of a virtual memory management apparatus according to the first embodiment. A virtual memory management apparatus 90 is provided inside the computing machine 80 and configured to execute virtual memory management. As shown in FIG. 2, the virtual memory management apparatus 90 is provided with an application program 21, an operating system 22, the volatile memory 11, and the nonvolatile memory 12.

The application program 21 is executed by the CPU 1 based on the operating system 22. Therefore, program codes and data of the application program 21 are located on the virtual memory. The CPU 1 designates a virtual address, reads and writes the application program 21, and executes the application program 21.

The operating system 22 is provided with a virtual memory management unit 23. Program codes and data of the operating system 22 are stored in the nonvolatile memory 12. Instead, program codes and data of the operating system 22 may be stored in the secondary memory unit 4 and the program codes and the data may be loaded into the volatile memory 11 at the time of starting the computing machine 80.

The virtual memory unit 23 is provided with a page transfer unit 25. The virtual memory management unit 23 manages virtual memory space and virtual addresses. The volatile memory 11 is provided with a plurality of clean pages 27 (clean pages 27a, 27b, 27c, and so on, for example). The nonvolatile memory 12 is provided with a plurality of dirty pages 28 (dirty pages 28a, 28b, 28c, and so on, for example) and a page table memory unit 51.

Here, a dirty page 28 means a page including data which has been rewritten in the primary memory unit 3 but has not been reflected yet in the secondary memory unit 4. In other words, the dirty page 28 means the page for which the data stored in the primary memory unit 3 is different from the data stored in the secondary memory unit 4. A clean page 27 means a page for which the data stored in primary memory unit 3 is the same as the data stored in the secondary memory unit 4.

The page transfer unit 25 executes transfer of pages between the volatile memory 11 and the nonvolatile memory 12. For example, the page transfer unit 25 transfers data of a clean page 27 in the volatile memory 11 to the nonvolatile memory 12 when writing a physical page. The page transfer unit 25 also transfers data of a dirty page 28 in the nonvolatile memory 12 to the volatile memory 11.

The page table memory unit 51 of the nonvolatile memory 12 is provided with a page table used to manage the clean pages and the dirty pages. The page table memory unit 51 communicates information on the clean pages and the dirty pages with the virtual memory management unit 23.

Figure 3:
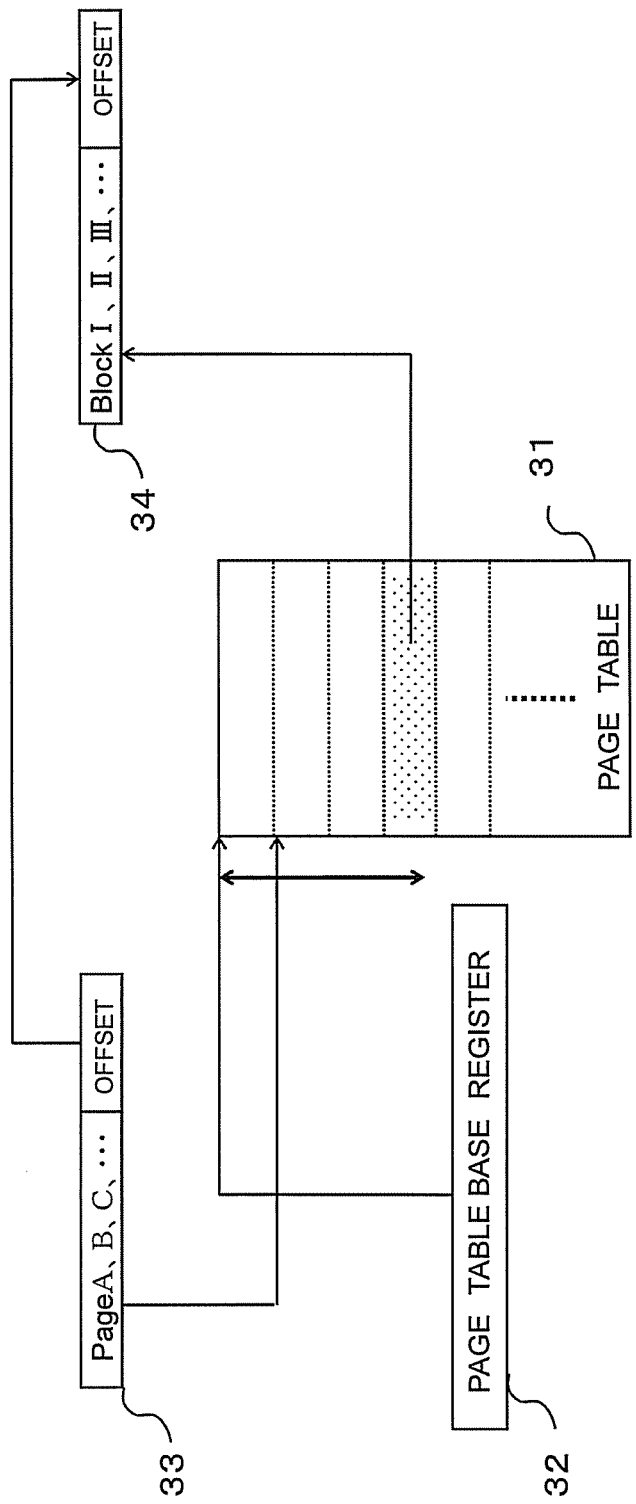
FIG. 3 is a view showing a layout of a page table according to the first embodiment.

FIG. 3 is a view showing a layout of the page table. As shown in FIG. 3, the virtual memory is carried out by paging using a page table 31 provided in the page table memory unit 51, for example. A virtual address 33 used for memory access includes pages and an offset. The pages (pages A, B, C, and so on, for example) in the virtual address 33 are arranged on the page table 31 in the order of numbers of logical pages by use of a page table base register 32. The MMU 2 refers to the page table 31 and translates the virtual pages into physical pages. In other words, the pages in the virtual address 33 arranged on the page table 31 are referred to by the MMU 2 and are translated into a block of physical addresses 34 used to access the primary memory unit 3.

Here, it is also possible to employ a method of allowing the operating system 22 to refer to the page table 31 and allowing the MMU 2 to refer to a TLB (translation look-aside buffer) which stores mapping of only part of the pages. In this case, the operating system 22 refers to the page table 31 and changes the contents of the TLB as appropriate. In any case, the operating system 22 executes rewriting of the page table 31.

The page table 31 provided in the page table memory unit 51 is provided in the nonvolatile memory 12, for example, in order to avoid loss of memory data in case of power outage. When a page table to manage the physical pages in the volatile memory 11 is separately provided, the page table 31 may be located in the volatile memory 11, and a page table to manage the physical pages of the nonvolatile memory 12 may be located in the nonvolatile memory 12. That is, a plurality of page tables are located in the nonvolatile memory 12 and in the volatile memory 11.

For allocating the physical pages in the virtual memory, the virtual memory management unit 23 manages unused physical pages by employing the page table 31. Instead, unused physical pages may be separately connected to manage the unused physical pages by forming a connection list.

A list of the unused physical pages is entirely located in the nonvolatile memory 12. Here, only the unused physical pages on the page table 31 may be separated individually, and these unused physical pages may be located in the nonvolatile memory 12.

The page table at least includes logical page numbers, physical page numbers, information indicating whether the pages are the dirty pages or the clean pages, and information linked to the foregoing information.

FIG. 4 is a view showing a configuration of the page table 31. As shown in FIG. 4, the page table 31 located in the nonvolatile memory 12, for example, is placed at an address designated by the page table base register 32 (logical pages, 0, 1, 2, 3, and so on in the drawing correspond to entries). The entries are arranged in the order of the logical page numbers and are used for reference when such reference is made by employing the logical page numbers of virtual memory addresses as indices. Each of the entries includes data of the physical page number, a presence bit, a bit indicating dirty/clean, a bit indicating the nonvolatile or volatile memory, data indicating Disk Addr (a disk address), data indicating protection, and the like.

The presence bit is set to "1" when the physical page number corresponding to the logical page number is present on the page table 31 or is set to "0" when the aforementioned physical page number is not present. The dirty/clean bit is set to "1" when the page corresponding to the logical page number is the dirty page or is set to "0" when the aforementioned page is the clean page. The nonvolatile memory/volatile memory bit is set to "1" when page data corresponding to the logical page number is located in the nonvolatile memory 12 or is set to "0" when the aforementioned data is located in the volatile memory 11.

An address in the Disk Addr data indicates a disk address in the secondary memory unit 4 corresponding to the logical page number. The protection bit indicates information on memory operation such as "read only".

Figure 5:
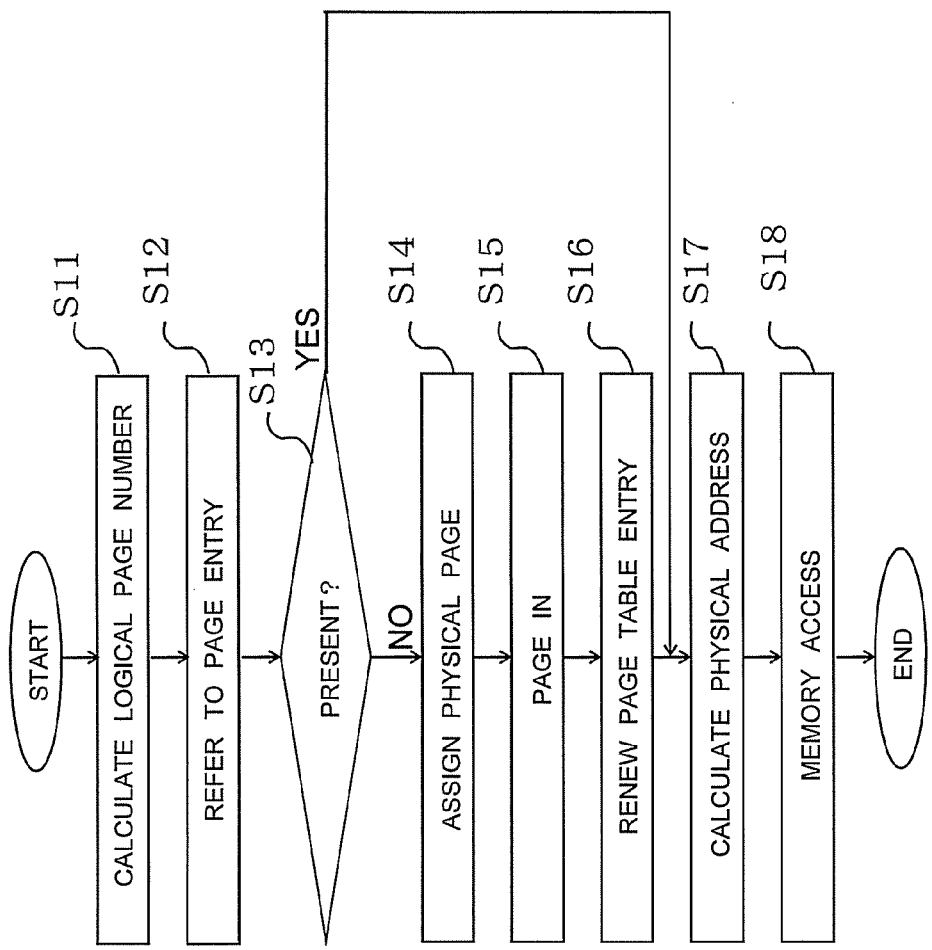
FIG. 5 is a flowchart showing processing to refer to a virtual memory according to the first embodiment.

Next, operations of the virtual memory management apparatus will be described with reference to FIG. 5 to FIG. 8. FIG. 5 is a flowchart showing processing to refer to a virtual memory.

As shown in FIG. 5, reference to the virtual memory is started when the application program 21 installed in the virtual memory management apparatus 90 indicates the logical address. Then, the operating system 22 installed in the virtual memory management apparatus 90 calculates the logical page number by using the logical address designated by the application program 21 (step S11). Here, high-order bits of the logical address represent the logical page number. For example, when the address space has 32 bits and a page size is 1 kB, high-order 22 bits of the logical address represent the logical page number.

Next, the operating system 22 refers to the information on the page table 31 by using the logical page number as the index and acquires the entry (step S12).

Subsequently, the operating system 22 judges whether the presence bit of the entry indicated with the logical page number on the page table 31 shown in FIG. 3 is set to "1" or "0" (step S13). When the presence bit is set to "1", the operating system 22 acquires the physical address from the entry (step S17). On the other hand, when the presence bit is set to "0", the content corresponding to the logical page number is not present on the primary memory unit 3 but is saved in the secondary memory unit 4. Accordingly, when the presence bit is set to "0", the operating system 22 assigns an unused physical page on the volatile memory 11 (step S14).

Then, the operating system 22 reads the content corresponding to the logical page number from the secondary memory unit 4 into the clean page in the primary memory unit 3 (step S15). Next, the operating system 22 renews the entry on the page table 31. To be more precise, the operating system 22 writes the physical page number assigned to the primary memory unit 3 into the entry, sets the presence bit to "1", and replaces the dirty bit with "0". In this case, a writing operation to the page is prohibited so as to transfer to the nonvolatile memory 12 at the time of writing (step S16).

Subsequently, the MMU 2 translates the logical address into the physical address. The physical address is generated by defining the physical page number read from the entry as high-order bits and defining the low-order offset of the logical address as low-order bits. For example, when the address space has 32 bits and the page size is 1 kB, the address is generated by defining the physical page number as high-order 22 bits and defining the offset of the logical address as low-order 10 bits (step S17).

Then the MMU 2 accesses to the primary memory unit 3 by using the generated physical address 34 (step S18).

Here, reference to the virtual memory is executed by using the single page table 31. Instead, reference to the virtual memory may be executed by using a plurality of page tables, or reference to the virtual memory may be executed by using the TLB. Alternatively, reference to the virtual memory may be executed by providing a plurality of page tables with different levels.

Figure 6:
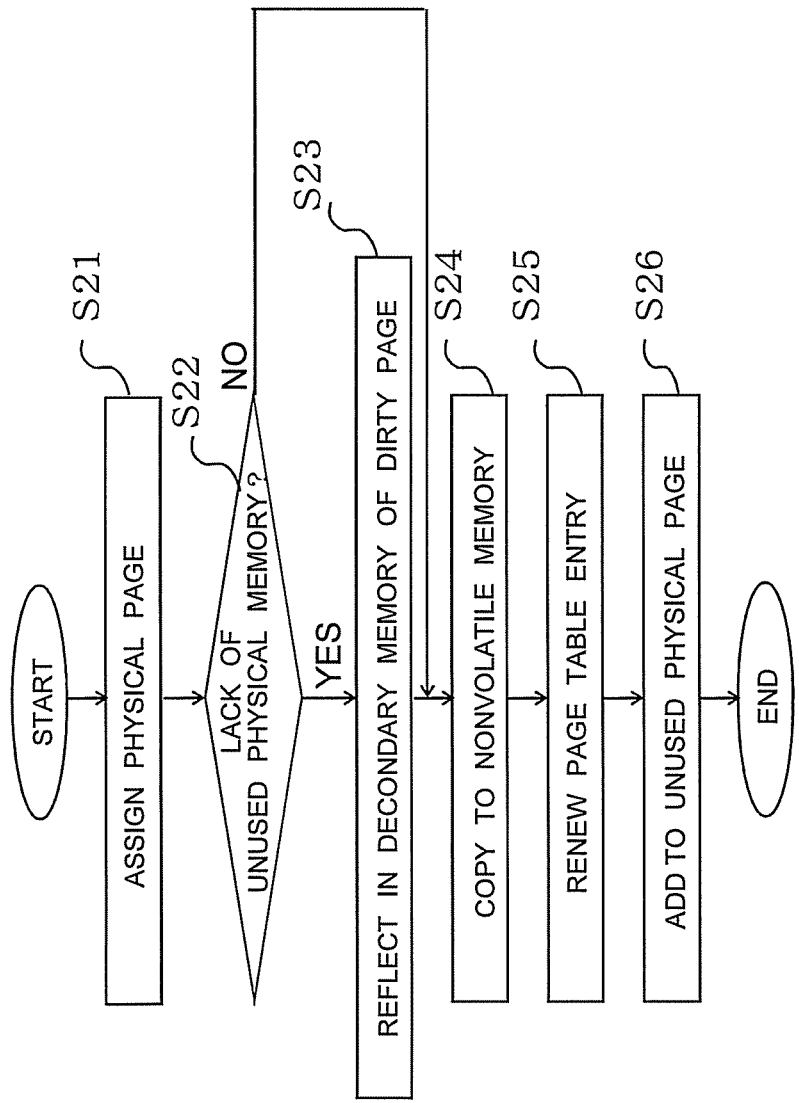
FIG. 6 is a flowchart showing processing to transfer to a nonvolatile memory according to the first embodiment.

FIG. 6 is a flowchart showing processing to transfer to a nonvolatile memory. As shown in FIG. 6, transfer to the nonvolatile memory 12 at the time of writing in the clean page is carried out in accordance with copy-on-write using a fault judgment by the MMU 2 as a trigger.

First, the operating system 22 permits only reading of the logical page corresponding to the volatile memory 11 and prohibits writing of the aforementioned logical page. A fault occurs when a writing operation is executed, whereby the control is transferred to the virtual memory management unit 23 of the operating system 22. The virtual memory management unit 23 takes an unused physical page on the nonvolatile memory 12 out of the page table 31 or the list of the unused physical pages (step S21).

Next, the virtual memory management unit 23 judges whether or not there is a lack of unused physical pages in the nonvolatile memory 12 (step S22). When there is no lack of unused physical pages in the nonvolatile memory 12, a process of copying to the nonvolatile memory 12 is carried out. When there is a lack of unused physical pages in the nonvolatile memory 12, the virtual memory management unit 23 increases unused physical pages by means of reflection in the secondary memory unit 4 (step S23).

Subsequently, the virtual memory management unit 23 copies the content of the physical page on the volatile memory 11 to the physical page on the nonvolatile memory 12 thus taken out (step S24).

Then, the virtual memory management unit 23 rewrites the page table entry and defines the physical page on the nonvolatile memory 12 as the physical page corresponding to the virtual page. Meanwhile, the virtual memory management unit 23 permits writing on the virtual page so as to avoid occurrence of a fault even when a writing operation takes place from then on (step S25).

Next, the virtual memory management unit 23 adds the physical page on the volatile memory 11 to one of the unused physical pages (step S26).

Here, when a writing operation in the page saved in the secondary memory unit 4 takes place, paging to the volatile memory 11 is executed once and then the fault occurs soon after and transfer to the nonvolatile memory 12 is executed. Instead, the virtual memory management unit 23 may assign the nonvolatile memory 12 from the beginning so as to omit the procedures of the transfer between the pages by performing page-in to the nonvolatile memory 12.

Next, reflection of the dirty page in the secondary memory unit 4 will be described. The virtual memory management unit 23 transfers many physical pages to the nonvolatile memory 12 for writing. When a free space in the nonvolatile memory 12 becomes scarce, the virtual memory management unit 23 selects part of the physical pages on the nonvolatile memory 12 and reflects the contents of the physical pages in the secondary memory unit 4. As for selection of pages, the page having the longest time elapsed since execution of the latest writing operation is selected, for example. After the reflection, the virtual memory management unit 23 replaces the dirty bit with "0".

After the reflection in the secondary memory unit 4, the dirty bit is recognized as the clean bit. After the recognition, the page transfer unit 25 of the virtual memory management unit 23 immediately transfers the physical page to the volatile memory 11. In this case, procedures of transfer processing to the nonvolatile memory 12 may be omitted upon occurrence of another writing operation in the physical page. Specifically, the virtual memory management unit 23 may delay actual transfer of the physical page and retain the physical page on the nonvolatile memory 12 until occurrence of another process that requires assignment of the physical page to a different virtual page.

Figure 7:
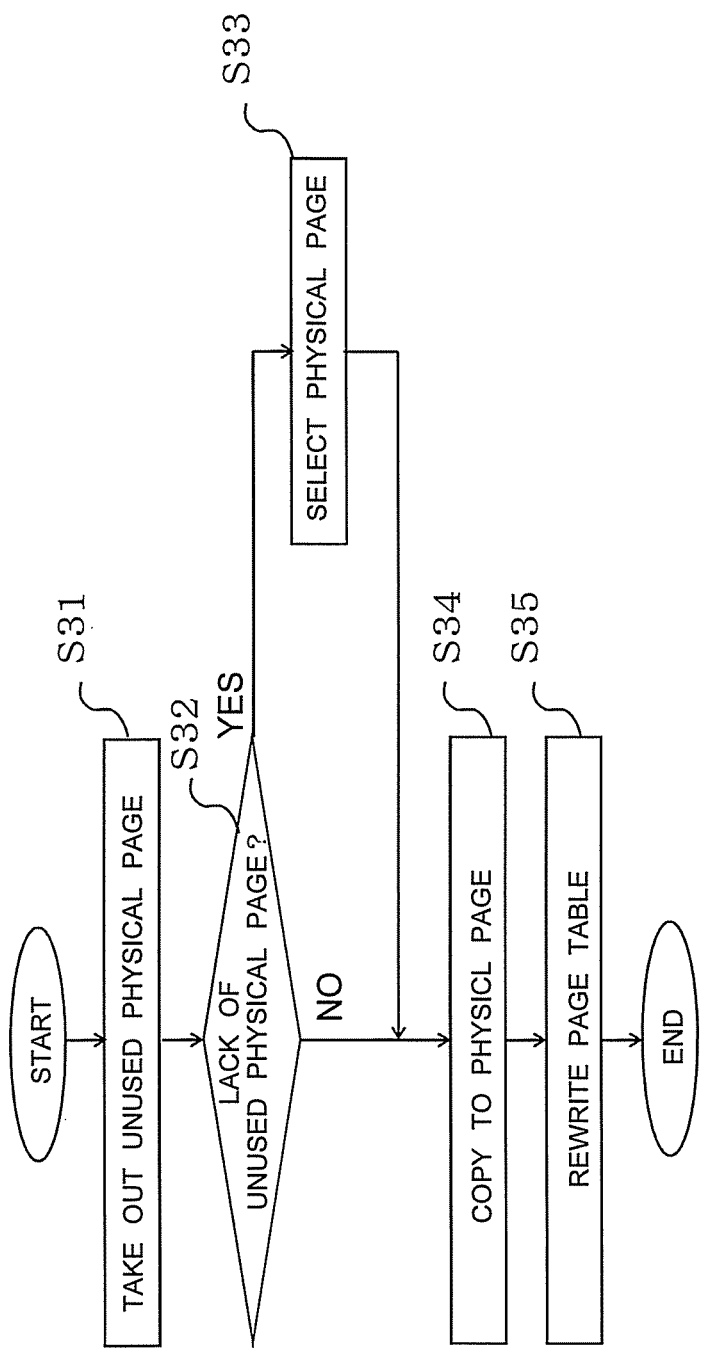
FIG. 7 is a flowchart showing page transfer processing according to the first embodiment.

FIG. 7 is a flowchart showing page transfer processing. As shown in FIG. 7, in the page transfer processing, the virtual memory management unit 23 firstly takes the unused physical page on the volatile memory 11 out of the page table 31 or the list of the unused physical pages (step S31).

Next, the virtual memory management unit 23 judges whether or not there is a lack of unused physical pages (step S32). When there is a lack of unused physical pages, the virtual memory management unit 23 selects a physical page on the volatile memory 11 and uses the selected physical page as the unused physical page. As for selection of page, the virtual memory management unit 23 selects the page having the longest time elapsed since execution of the latest writing operation, for example. The information on the physical page on the volatile memory 11 has been reflected in the secondary memory unit 4. Therefore, new reflection is not necessary in the case of using the physical page as the unused physical page (step S33).

When there is no lack of unused physical pages (or after selection of the physical page), the virtual memory management unit 23 copies the information of the physical page on the nonvolatile memory 12 to the physical page on the volatile memory 11 (step S34).

Subsequently, the virtual memory management unit 23 rewrites the page table 31 and defines the physical page on the volatile memory 11 as the physical page corresponding to the virtual page. The virtual memory management unit 23 also prohibits the writing operation on the virtual page so as to cause a fault when a writing operation takes place from then on. The virtual memory management unit 23 adds the page on the nonvolatile memory 12 to one of the unused physical pages (step S35).

In the embodiment, the operating system 22 provides a flag to indicate whether or not it is necessary to initialize the page table 31 after reboot on a specific bit at a specific address either on the nonvolatile memory 12 or on the secondary memory unit 4. At the time of start up, the operating system 22 sets the specific bit to "0". When the virtual memory need not be continuously used at the time of shutdown, the operating system 22 replaces the specific bit with "1" and then shuts down. When the computing machine 80 is suddenly stopped due to power outage, the specific bit retains the value "0".

Figure 8:
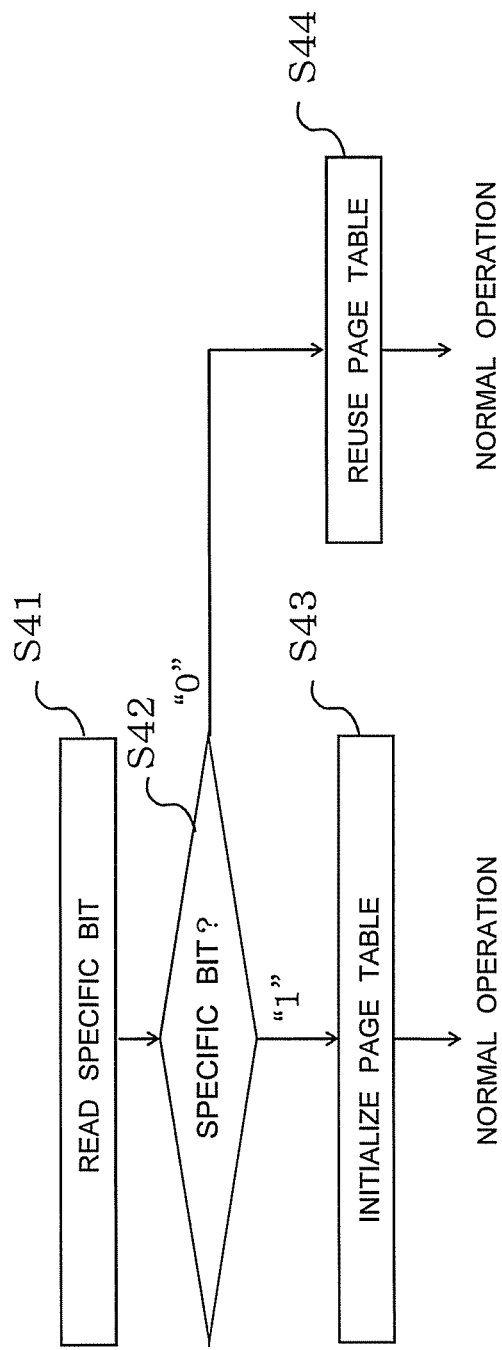
FIG. 8 is a flowchart showing processing in a case of reboot according to the first embodiment.

FIG. 8 is a flowchart showing processing in a case of reboot. As shown in FIG. 8, in the processing at the time of reboot, the operating system 22 reads the specific bit after the reboot of the computing machine 80 (step S41).

Next, the operating system 22 judges whether the specific bit thus read out is set to "1" or "0" (step S42).

The operating system 22 executes initialization of the page table 31 only when the read specific bit is set to "1", i.e., when such initialization is requested. Specifically, the operating system 22 establishes a state where there are no physical memories corresponding to the virtual memories. Alternatively, the operating system 22 establishes a state where the value "0" is written in all the physical memories corresponding to the virtual memories (step S43).

In the case where the read specific bit is set to "0", i.e., when the computing machine 80 is rebooted after the power outage or when reflection in the secondary memory unit 4 is omitted at the time of shutdown of the operating system 22, the operating system 22 reuses the page table 31 saved in the nonvolatile memory 12 (step S44).

When the page table to manage the physical pages on the volatile memory 11 is separately managed, the operating system 22 always initializes the page table only. The operating system 22 initializes the page table to manage the physical pages on the nonvolatile memory 12 only when the flag is set to "1".

By executing the processing as described above, the page table 31 for the physical pages on the nonvolatile memory 12 and the information on the physical pages on the nonvolatile memory 12 will be saved after reboot. For the purpose of avoiding loss of information such as process contexts in case of power outage in order to continuously execute a program, the information is separately stored in the nonvolatile memory 12. Then, the information needs to be reconstructed after rebooting the computing machine 80 by use of a method similar to one applied to the page table.

As described above, according to the virtual memory management apparatus of the embodiment, the computing machine 80 is provided with the CPU 1, the MMU 2, the primary memory unit 3, and the secondary memory unit 4. The virtual memory management apparatus 90 is embedded in the computing machine 80 and is provided with the application program 21, the operating system 22, the volatile memory 11, and the nonvolatile memory 12. The operating system 22 is provided with the virtual memory management unit 23 which includes the page transfer unit 25. The volatile memory 11 is provided with the plurality of clean pages. The nonvolatile memory 12 is provided with the plurality of dirty pages and the page table memory unit 51. The page transfer unit 25 transfers the data of the dirty pages on the nonvolatile memory 12 to the volatile memory 11 when the data of the dirty pages on the nonvolatile memory 12 is to be reflected in the secondary memory unit 4.

As a consequence, the information on the clean pages and the dirty pages will not be lost in case of power outage. Moreover, at the time of rebooting the computing machine 80 after the power outage, the page table for the virtual memory is reconstructed based on the information on the nonvolatile memory 12. Accordingly, information indicating which virtual pages are the dirty pages and information written in virtual pages for the dirty pages will be saved after reboot. Moreover, the written information does not have to be reflected in the secondary memory unit 4 frequently. Hence it is possible to reduce input and output operations between the secondary memory unit 4 and the physical memories and to improve a processing speed of the computing machine 80.

Second Embodiment

Figure 9:
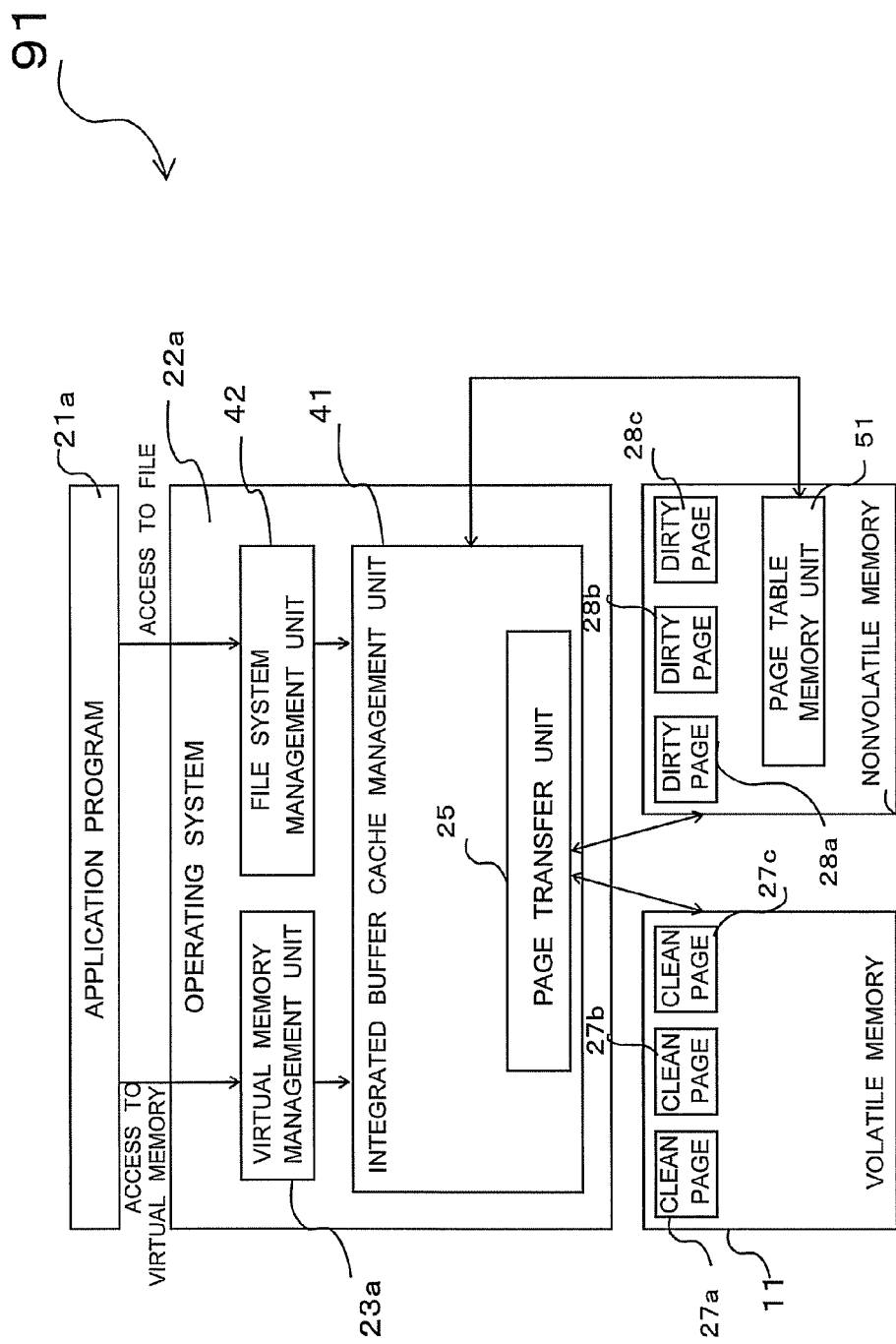
FIG. 9 is a block diagram showing a configuration of a virtual memory management apparatus according to a second embodiment.

Next, a virtual memory management apparatus according to a second embodiment will be described with reference to the drawings. FIG. 9 is a block diagram showing a configuration of a virtual memory management apparatus. In the embodiment, an operating system is provided with a virtual memory management unit and a file system management unit, and physical memories are allocated to paging and to buffer caches as appropriate.

Hereinafter, a portion with the same configuration in the first embodiment is provided with the same numeral, a description of the portion will not be repeated, and only a portion with a different configuration is described.

As shown in FIG. 9, a virtual memory management apparatus 91 is provided with an application program 21a, an operating system 22a, a volatile memory 11, and a nonvolatile memory 12. The virtually memory management apparatus 91 is the apparatus embedded in a computing machine and configured to execute virtual memory management in the similar manner as in the first embodiment.

The application program 21a is executed by the CPU 1 based on the operating system 22a. Therefore, program codes and data of the application program 21a are located on the virtual memory. The application program 21a designates a virtual address and performs reading and writing. The CPU 1 designates a virtual memory, reads and writes the application program 21a, and executes the application program 21a.

The operating system 22a is provided with a virtual memory management unit 23a, an integrated buffer cache management unit 41, and a file system management unit 42. The integrated buffer cache management unit 41 is provided with a page transfer unit 25.

An unillustrated buffer cache is provided in a physical memory and is configured to retain part of file data in the secondary memory unit 4 on the physical memory. The buffer cache finishes part of file input and output operations only by referring to the physical memory, and thereby reduces input and output operation to and from the secondary memory unit 4 so as to speed up processing.

The virtual memory management unit 23a manages access to the virtual memory. The file system management unit 42 manages access to files.

The integrated buffer cache management unit 41 consolidates management of virtual memory and file processing. The integrated buffer cache management unit 41 communicates information on clean pages and dirty pages with a page table memory unit 51. The integrated buffer cache management unit 41 performs similar operations to the first embodiment and executes processing in response to a file write request from the application program 21a to the operating system 22a. Specifically, the integrated buffer cache management unit 41 transfers a buffer cache page from the volatile memory 11 to the nonvolatile memory 12 when the application program 21a writes in a file. Moreover, the integrated buffer cache management unit 41 transfers the buffer cache page from the nonvolatile memory 12 to the volatile memory 11 when information in the buffer cache is to be reflected in a file on the secondary memory unit 4. Here, there is no address translation by the MMU 2 or occurrence of a page fault unlike the first embodiment, and all of the processing is executed by the operating system 22a.

In the embodiment, the physical memories are flexibly allocated to paging and to buffer aches as appropriate using the consolidated management by the integrated buffer cache management unit 41. Accordingly, the physical memories can be used effectively. For example, in the case of executing the application program 21a that consumes a large amount of virtual memories, more physical memories can be allocated to the virtual memory used by paging while the remaining small amount of the physical memories can be allocated to the buffer cache.

As described above, the virtual memory management apparatus of the embodiment is provided with the application program 21a, the operating system 22a, the volatile memory 11, and the nonvolatile memory 12. The operating system 22a is provided with the virtual memory management unit 23a, the integrated buffer cache management unit 41, and the file system management unit 42. The integrated buffer cache management unit 41 is configured to consolidate the management of paging and buffer caches and is provided with the page transfer unit 25. The volatile memory 11 is provided with the plurality of clean pages. The nonvolatile memory 12 is provided with the plurality of dirty pages and the page table memory unit 51. The page transfer unit 25 transfers the data of the dirty pages on the nonvolatile memory 12 to the volatile memory 11 when the data of the dirty pages on the nonvolatile memory 12 is to be reflected in the secondary memory unit 4.

Accordingly, in addition to effects similar to those in the first embodiment, the physical memories are flexibly allocated to paging and buffer caches as appropriate. Hence the physical memories can be used more effectively than in the first embodiment.

The invention is not limited only to the above-described embodiments and various modifications may be made without departing from the scope of the invention.

Although the virtual memory management apparatuses of the embodiments have applied to the computing machine provided with the primary memory unit and the secondary memory unit, the invention is also applicable to an information processing apparatus such as a mobile device provided with a primary memory unit and a secondary memory unit and configured to perform information processing.

What is claimed is:

1. A virtual memory management apparatus including a primary memory unit and a secondary memory unit having a lower memory access speed than the primary memory unit and having a larger memory capacity than the primary memory unit,
   the virtual memory management apparatus comprising:
   a volatile memory located in the primary memory unit, the volatile memory being configured to store data of a clean page being identical to data stored in the secondary memory unit; and
   a nonvolatile memory located in the primary memory unit, the nonvolatile memory being configured to store data of a dirty page different from the data stored in the secondary memory unit and having a page table at least including information indicating which page is the dirty page; and
   a page transfer unit configured to transfer the data of the dirty page to the volatile memory when the data of the dirty page on the nonvolatile memory is to be reflected in the secondary memory unit.

2. The apparatus according to claim 1, wherein the page transfer unit transfers the data of the clean page on the volatile memory to the nonvolatile memory.

3. The apparatus according to claim 1, wherein the volatile memory is any one of SRAM and DRAM, and the nonvolatile memory is any one of FeRAM, MRAM, and ReRAM.

4. The apparatus according to claim 1, wherein the secondary memory unit is any one of hard disk storage and a flash memory.

5. A virtual memory management apparatus including a primary memory unit and a secondary memory unit having a lower memory access speed than the primary memory unit and having a larger memory capacity than the primary memory unit,
   the virtual memory management apparatus comprising:
   a volatile memory located in the primary memory unit, the volatile memory being configured to store data of a clean page being identical to data stored in the secondary memory unit;
   a nonvolatile memory located in the primary memory unit, the nonvolatile memory being configured to store data of a dirty page different from the data stored in the secondary memory unit and having a page table at least including information indicating which page is the dirty page;
   a virtual memory management unit configured to manage access to a virtual memory;

a file system management unit configured to manage access to a file; and an integrated buffer cache management unit including a page transfer unit configured to transfer the data of the dirty page to the volatile memory when the data of the dirty page on the nonvolatile memory is to be reflected in the secondary memory unit, the integrated buffer cache management unit being configured to allocate a physical memory to paging and a buffer cache.

6. The apparatus according to claim 5, wherein the page transfer unit transfers the data of the clean page on the volatile memory to the nonvolatile memory.

7. The apparatus according to claim 5, wherein the volatile memory is any one of SRAM and DRAM, and the nonvolatile memory is any one of FeRAM, MRAM, and ReRAM.

8. The apparatus according to claim 5, wherein the secondary memory unit is any one of hard disk storage and a flash memory.

9. A memory management apparatus including a primary memory unit and a secondary memory unit having a lower memory access speed than the primary memory unit and having a larger memory capacity than the primary memory unit,
the memory management apparatus comprising:
a volatile memory located in the primary memory unit, the volatile memory being configured to store data of a clean page being identical to data stored in the secondary memory unit;
a nonvolatile memory located in the primary memory unit, the nonvolatile memory being configured to store data of a dirty page different from the data stored in the secondary memory unit and having a page table at least including information indicating which page is the dirty page; and
a page transfer unit configured to transfer the data of the dirty page to the volatile memory when the data of the dirty page on the nonvolatile memory is to be reflected in the secondary memory unit.

10. The apparatus according to claim 9, wherein the page transfer unit transfers the data of the clean page on the volatile memory to the nonvolatile memory.

11. The apparatus according to claim 9, wherein the volatile memory is any one of SRAM and DRAM, and the nonvolatile memory is any one of FeRAM, MRAM, and ReRAM.

12. The apparatus according to claim 9, wherein the secondary memory unit is any one of hard disk storage and a flash memory.

13. A memory management apparatus including a primary memory unit and a secondary memory unit having a lower memory access speed than the primary memory unit and having a larger memory capacity than the primary memory unit,
the memory management apparatus comprising:
a volatile memory located in the primary memory unit, the volatile memory being configured to store data of a clean page being identical to data stored in the secondary memory unit;
a nonvolatile memory located in the primary memory unit, the nonvolatile memory being configured to store data of a dirty page different from the data stored in the secondary memory unit and having a page table at least including information indicating which page is the dirty page;
a memory management unit configured to manage access to a virtual memory;
a file system management unit configured to manage access to a file; and
an integrated buffer cache management unit including a page transfer unit configured to transfer the data of the dirty page to the volatile memory when the data of the dirty page on the nonvolatile memory is to be reflected in the secondary memory unit, the integrated buffer cache management unit being configured to allocate a physical memory to paging and a buffer cache.

14. The apparatus according to claim 13, wherein the page transfer unit transfers the data of the clean page on the volatile memory to the nonvolatile memory.

15. The apparatus according to claim 13, wherein the volatile memory is any one of SRAM and DRAM, and the nonvolatile memory is any one of FeRAM, MRAM, and ReRAM.

16. The apparatus according to claim 13, wherein the secondary memory unit is any one of hard disk storage and a flash memory.

* * * * *